United States Patent
Farrar et al.

(10) Patent No.: US 6,696,746 B1
(45) Date of Patent: *Feb. 24, 2004

(54) BURIED CONDUCTORS

(75) Inventors: Paul A. Farrar, So. Burlington, VT (US); Wendell P. Noble, Milton, VT (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/069,326

(22) Filed: Apr. 29, 1998

(51) Int. Cl.$^7$ .......................... H01L 29/40; H01L 29/76
(52) U.S. Cl. ......................... 257/621; 257/397
(58) Field of Search ................ 257/370, 375, 257/382, 383, 621, 349, 347, 508, 486, 503, 573, 574, 736, 758, 759, 763, 764, 296, 397, 905–908; 438/524, 526, 529, 239–256

(56) References Cited

U.S. PATENT DOCUMENTS

| | | | |
|---|---|---|---|
| 4,461,041 A | 7/1984 | Dobrovolny | 455/328 |
| 4,503,451 A * | 3/1985 | Lund et al. | 357/42 |
| 4,939,567 A * | 7/1990 | Kenney | 357/42 |
| 4,977,439 A * | 12/1990 | Esquivel et al. | 357/49 |
| 5,202,754 A | 4/1993 | Bertin et al. | 257/684 |
| 5,227,658 A | 7/1993 | Beyer et al. | 257/522 |
| 5,232,866 A | 8/1993 | Beyer et al. | 437/62 |
| 5,270,261 A | 12/1993 | Bertin et al. | 438/109 |
| 5,349,743 A | 9/1994 | Grader et al. | 29/602.1 |
| 5,371,390 A | 12/1994 | Mohsen | 257/209 |
| 5,382,832 A * | 1/1995 | Buti et al. | 257/773 |
| 5,396,093 A | 3/1995 | Lu | 257/306 |
| 5,410,169 A | 4/1995 | Yamamoto et al. | 257/301 |
| 5,436,173 A * | 7/1995 | Houston | 257/502 |
| 5,438,009 A | 8/1995 | Yang et al. | 437/52 |
| 5,497,017 A * | 3/1996 | Gonzales | 257/306 |
| 5,504,357 A * | 4/1996 | Kim et al. | 257/306 |
| 5,593,921 A | 1/1997 | Chen et al. | 437/195 |
| 5,646,067 A | 7/1997 | Gaul | 437/180 |
| 5,705,425 A | 1/1998 | Miura et al. | 437/182 |
| 5,734,676 A | 3/1998 | Dingsor | 375/222 |
| 5,747,867 A * | 5/1998 | Oppermann | 257/507 |
| 5,760,456 A | 6/1998 | Grzegorek et al. | 257/531 |
| 5,798,544 A * | 8/1998 | Ohya et al. | 257/296 |
| 5,874,770 A | 2/1999 | Saia et al. | 257/536 |
| 5,891,513 A | 4/1999 | Dubin et al. | 427/98 |
| 5,892,425 A | 4/1999 | Kuhn et al. | 336/200 |
| 5,892,707 A * | 4/1999 | Noble | 257/905 |
| 5,903,489 A | 5/1999 | Hayano | 365/51 |
| 5,930,596 A | 7/1999 | Klose et al. | 438/98 |
| 5,930,668 A | 7/1999 | Gardner | 438/624 |
| 5,969,422 A | 10/1999 | Ting et al. | 257/762 |
| 6,025,261 A | 2/2000 | Farrar et al. | 438/619 |
| 6,037,258 A | 3/2000 | Liu et al. | 438/687 |
| 6,081,988 A | 7/2000 | Pluymers et al. | 29/601 |
| 6,181,163 B1 | 1/2001 | Agrawal et al. | 326/41 |
| 6,239,684 B1 | 5/2001 | Farrar et al. | 336/200 |
| 6,271,087 B1 | 8/2001 | Kinoshita et al. | 438/258 |
| 6,376,895 B2 | 4/2002 | Farrar et al. | 257/531 |
| 6,377,156 B2 | 4/2002 | Farrar et al. | 366/200 |
| 6,458,690 B2 | 10/2002 | Takewaki et al. | 438/637 |

FOREIGN PATENT DOCUMENTS

| | | | | |
|---|---|---|---|---|
| GB | 2179787 | * | 3/1987 | 437/57 |

* cited by examiner

*Primary Examiner*—Ori Nadav
(74) *Attorney, Agent, or Firm*—Schwegman, Lundberg, Woessner & Kluth, P.A.

(57) ABSTRACT

Buried conductors within semiconductor devices and structures, and methods for forming such conductors, are disclosed. In one embodiment of the invention, a semiconductor structure includes a substrate and a plurality of conductive elements buried within the substrate. The conductive elements may be metal, such as tungsten or a tungsten alloy. The invention described in the disclosure provides for advantages including formation of three-dimensional structures without resort to external wiring.

31 Claims, 7 Drawing Sheets

BURIED CONDUCTORS

RELATED APPLICATION

This application is related to cofiled, copending and coassigned application entitled "Hi Q Inductive Elements", U.S. application Ser. No. 9/069,346, now U.S. Pat. No. 6,025,261.

FIELD OF THE INVENTION

This invention relates generally to semiconductor technology, and more particularly to buried conductors within semiconductor devices and structures, and methods for forming such conductors.

BACKGROUND OF THE INVENTION

Semiconductor technology pervades most electronic devices today. Computers, televisions, videocassette recorders, cameras, etc., all use semiconductor integrated circuits to varying degrees. For example, the typical computer includes microprocessors and dedicated controller integrated circuits (i.e., video controllers, audio controllers, etc.), as well as memory, such as dynamic random-access memory.

Traditionally, the semiconductor industry has used a process that requires first building a device or series of devices, and then connecting the devices together with a wiring level or levels above the active-device surfaces. As integrated circuit designs have become more complex, several external wiring planes have been used to connect adjacent devices. As the number of wiring levels grew, the requirement of the vertical connections has significantly reduced the usefulness of the lower levels.

A limited prior art solution is to use a single buried wiring level in the initial phases of semiconductor fabrication. A single buried wiring level overcomes the limitations of using external wiring planes, but is not entirely applicable to current semiconductor technology. For example, stacked chip arrays require more than one wiring level. Therefore, even if a single buried wiring level is used, external wiring planes are still nevertheless required.

For these and other reasons, there is a need for multiple buried wiring levels within a single semiconductor device or structure.

SUMMARY OF THE INVENTION

The above-identified disadvantages, shortcomings and problems are overcome by the present invention, which will be understood by reading and studying the following specification. In one embodiment of the invention, a semiconductor structure includes a substrate and a plurality of conductive elements buried within the substrate. The conductive elements may be metal, such as tungsten or a tungsten alloy.

The use of a plurality of conductive elements buried within the substrate of a semiconductor structure overcomes limitations found in the prior art. For example, where each conductive element is a separate buried plane, there may be two or more such planes, such that a three-dimensional semiconductor structure may be formed. Three-dimensional structures, as those of ordinary skill within the art can appreciate, have the ability to significantly reduce the average distance from one segment of a large computer processor and associated memory to another, allowing for higher-density semiconductor storage devices and faster processors.

The invention includes semiconductor structures, devices, and methods to form such structures and devices, of varying scope. In addition to the aspects and advantages of the present invention described in this summary, further aspects and advantages of the invention will become apparent by reference to the drawings and by reading the detailed description that follows.

BRIEF DESCRIPTION OF THE DRAWINGS

FIGS. 1(*a*), 1(*b*) and 1(*c*) show exemplary semiconductor structures according to varying embodiments of the invention;

FIGS. 2(*f*) and 2(*g*) show cross-sectional views respectively taken generally along lines 2(*f*)–2(*f*) and 2(*g*)–2(*g*) of FIG. 2(*a*).

FIGS. 3(*a*), 3(*b*), 3(*c*), 3(*d*) and 3(*e*) show a process to form buried conductors according to an embodiment of the invention; and, FIG. 4 shows a representative semiconductor memory device in conjunction with which embodiments of the invention may be practiced.

DETAILED DESCRIPTION OF THE INVENTION

In the following detailed description of exemplary embodiments of the invention, reference is made to the accompanying drawings which form a part hereof, and in which is shown by way of illustration specific exemplary embodiments in which the invention may be practiced. These embodiments are described in sufficient detail to enable those skilled in the art to practice the invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the appended claims.

The detailed description is divided into five sections. In the first section, exemplary structures having buried conductors are described. In the second section, a method by which buried conductors may be formed according to one embodiment of the invention is provided. In the third section, processes to form the exemplary structures of the first section are given. In the fourth section, a representative memory device in conjunction with which embodiments of the invention may be practiced is presented. Finally, in the fifth section, a conclusion is provided.

Exemplary Structures

In this section of the detailed description, exemplary structures according to varying embodiments of the invention are presented. Those of ordinary skill within the art will appreciate that the structures described in this section are merely exemplary, and the invention is not limited to these particular structures. Rather, a description of the exemplary structures is provided to inform those of ordinary skill within the art the types of structures covered by the invention. The structures may thus be utilized in the formation of a semiconductor device incorporating the structures.

Figure 1A:
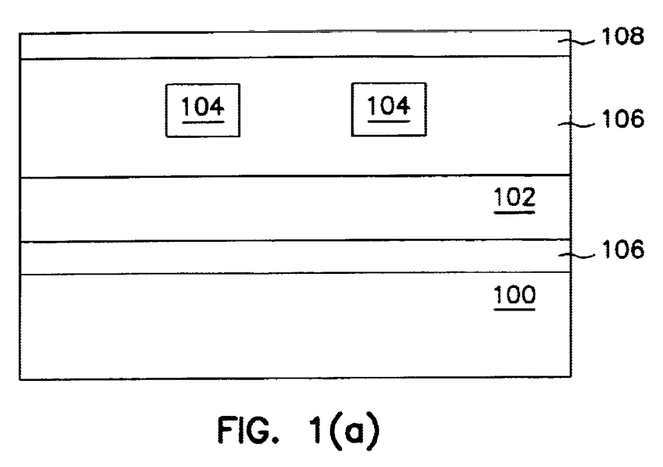

Referring first to FIG. 1(*a*), one such exemplary structure is shown. Within N+ substrate 100 (i.e., doped silicon) are two buried conductive layers, layer 102 and layer 104. Layer 102 includes a series of conductive lines separated by an insulative material, where the conductive lines are parallel to the view shown in FIG. 1(*a*), such that only one such line is seen. Layer 104 includes a series of conductive lines also separated by an insulative material, but where the conductive lines are perpendicular to the view shown in FIG. 1(a), such that two such lines are seen. Layer 102 may thus be described as oriented in an x plane, and layer 104 oriented in a y plane. A conductive element may refer to either a layer within a semiconductor structure, or a conductive line within such a layer.

The invention is not particularly limited to the type of material utilized to form the buried conductive layers or elements. A metal, such as tungsten or a tungsten alloy, is desirably used. Other metals include the non-radioactive elements selected from groups IVB, VB, VIB, VIIB, and VIIIB of the periodic table, and alloys of such elements. Each conductive element, be it a separate layer or a line within a layer, may be of the same material, or a different material, as the other conductive elements.

Insulative material 106 surrounds conductive layers 102 and 104, to prevent short circuiting. The invention is also not particularly limited to the type of insulative material used. In one embodiment of the invention, silicon dioxide, also known as oxide, is utilized. Other insulative materials amenable to the invention include nitride, and oxy-nitride.

Over the layer formed by insulative material 106, as shown in FIG. 1(a) is active semiconductor layer 108 (e.g., a P– epitaxial layer). The active circuitry of the semiconductor structure are formed within this layer. Because layer 108 rests on an insulator layer (material 106), such active circuitry includes silicon-on-insulator (SOI), as known within the art.

Optionally, a connection between layers 102 and 104 may also be made, or between either layer and active semiconductor layer 108, using ion-implanted nickel, as described in the coassigned and copending application entitled "Implanted Conductor and Method of Making," filed Mar. 14, 1997, Ser. No. 08/818,230, which is hereby incorporated by reference, or using a conventional fill strategy as known within the art.

Those of ordinary skill within the art can also appreciate that additional conductive layers may also be formed. Thus, third, fourth, fifth, et seq., layers may be formed within the structure as necessary. These other layers may be positioned above or below the other layers, and may have lines oriented in a direction parallel to or orthogonal to the directions in which the lines of the other layers are oriented. All the conductive layers provide for internal wiring within the semiconductor structure, to allow three-dimensional structures to be formed.

Figure 1B:
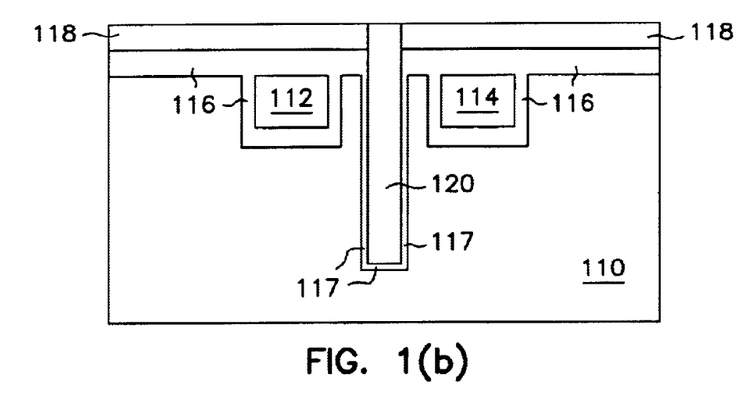

Referring next to FIG. 1(b), another exemplary structure according to an embodiment of the invention is shown. Within N+ substrate 110 are two buried conductive elements, lines 114 and lines 114. Insulative material 116 surrounds each line, and also separates lines 114 from active semiconductor layer 118. In addition, deep trench capacitor 120 cuts through active layer 118, insulative material 116, and within substrate 110 between lines 114. The deep trench capacitor trench is filled with P+ silicon, and is surrounded by dielectric material 117. An alternative embodiment to that of FIG. 1(b) might have an additional level of buried elements, where the elements are located either in front of and/or behind the plane of the trench capacitor.

Figure 1C:
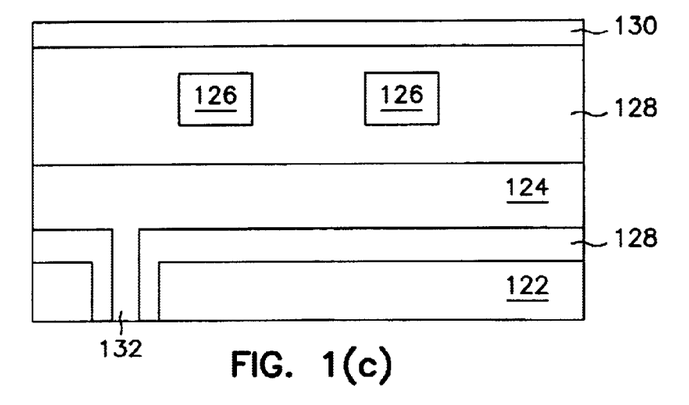

Referring now to FIG. 1(c), still another exemplary structure according to an embodiment of the invention is shown. Within N+ substrate 122 are two buried conductive layers, layer 124 and 126. Each layer includes a series of conductive lines. Layer 124 is oriented in an x plane (parallel to the view shown in FIG. 1(c)), and layer 126 is oriented in a y plane (perpendicular to the view shown in FIG. 1(c)). Insulative material 128 surrounds conductive layers 124 and 126. Active semiconductor layer 130 lies above the layer formed by insulative material 128.

Conductive connection 132 is formed prior to the buried wiring, as those of ordinary skill within the art can appreciate. Conductive connection 132 thus provides an external connection to layer 124; connection 132 cuts through substrate 122 at the back (bottom) of the structure of FIG. 1(c). Connection 132 may then allow the die of which the structure is a part to be attached electrically to another structure of another die, as described in U.S. Pat. Nos. 5,270,261 and 5,202,754, which are hereby incorporated by reference.

Connection 132 is desirably formed by first etching a hole within substrate 122, and then oxidizing the surface to provide for insulative material 128 around the hole. A conductive plug may then be deposited to form connection 132. A metal, such as tungsten or a tungsten alloy, may be the material utilized to form the connection. The invention is not so particularly limited, however.

Figure 2A:
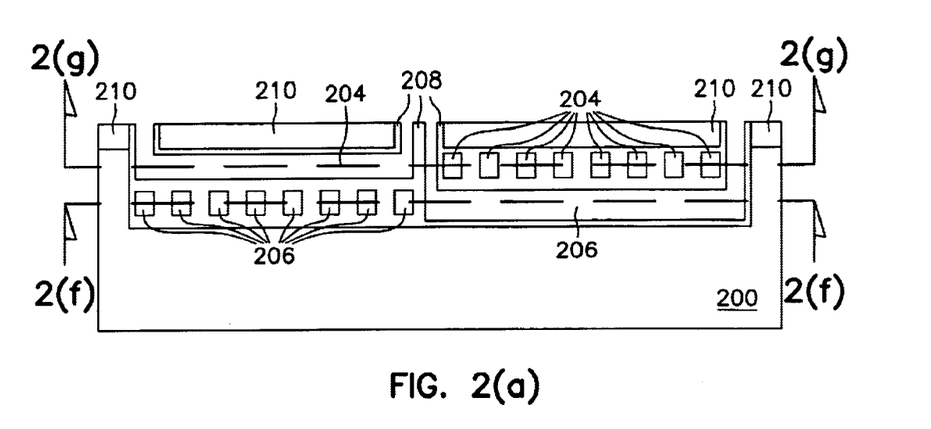

Another exemplary structure according to an embodiment of the invention is shown by reference to FIGS. 2(a)–2(e). Referring first to FIG. 2(a), within N+ substrate 200 are two buried conductive layers, layer 204 and 206, each having a plurality of lines. Each layer is oriented in both the x and y planes; that is, each has a plurality of lines oriented in both the x and y planes. Insulative material 208 surrounds conductive layers 204 and 206. Active semiconductor layer 210 lies above the layer formed by insulative material 208. As shown in FIG. 2(a), the parts of each layer 204 and 206 oriented in the x plane, parallel to the view shown in FIG. 2(a), are accessible from the top of the structure. That is, a conductive connection to each of these parts of layers 204 and 206 cuts through active layer 210 and the layer formed by insulative material 208.

Figure 2B:
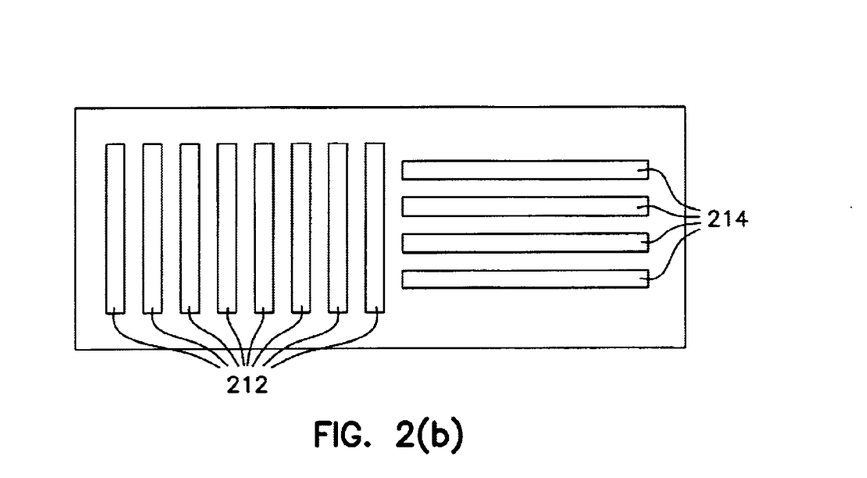

Referring next to FIG. 2(b), a first mask pattern used to produce the trenches for (first, lower) layer 206 of the structure is shown. Lines 212 correspond to the lines of conductive layer 206 that are oriented in the y plane, and lines 214 correspond to the lines of conductive layer 206 that are oriented in the x plane. Exposure of the substrate layer using this first mask pattern, and subsequent etching, thus results in the formation of trenches which, when deposited with conductive material, make for the lines of layer 206, as those of ordinary skill within the art can appreciate.

Figure 2C:
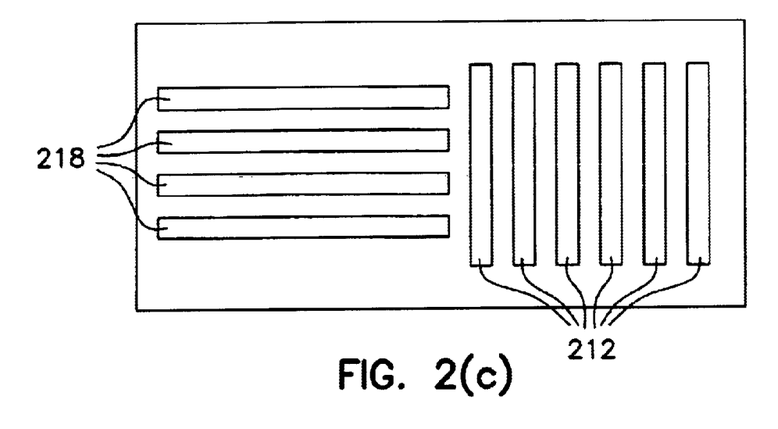

Similarly, referring to FIG. 2(c), a second mask pattern used to produce the trenches for (second, higher) layer 204 of the structure is shown. Lines 216 correspond to the lines of conductive layer 204 that are oriented in the y plane, and lines 218 correspond to the lines of conductive layer 204 that are oriented in the x plane. Exposure of the substrate layer, after formation of layer 204, using this second mask pattern, and subsequent etching, thus results in the formation of trenches which, when deposited with conductive material, make for the lines of layer 204.

Figure 2D:
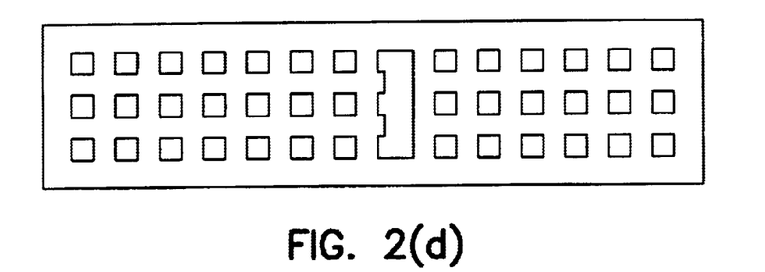
Figure 2E:
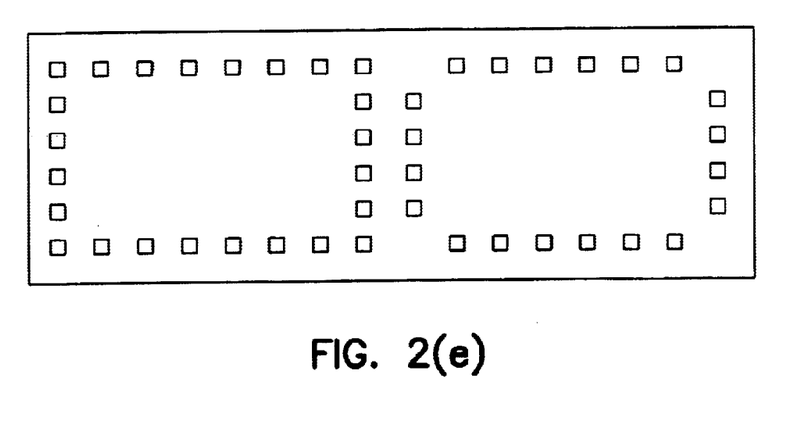
Figure 2F:
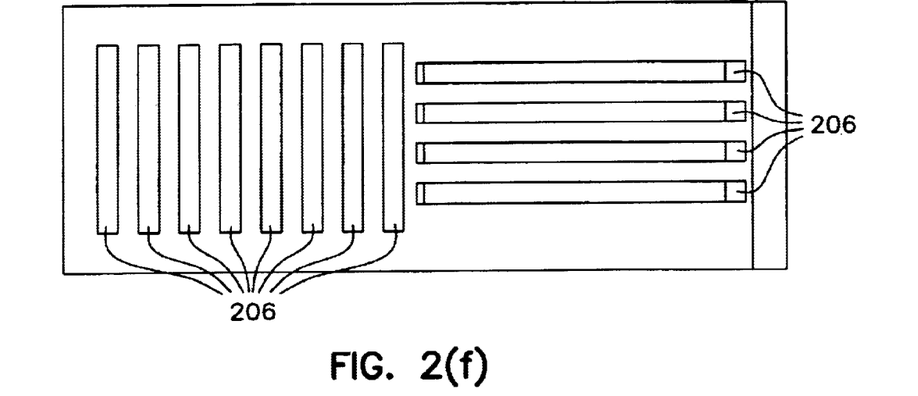
Figure 2G:
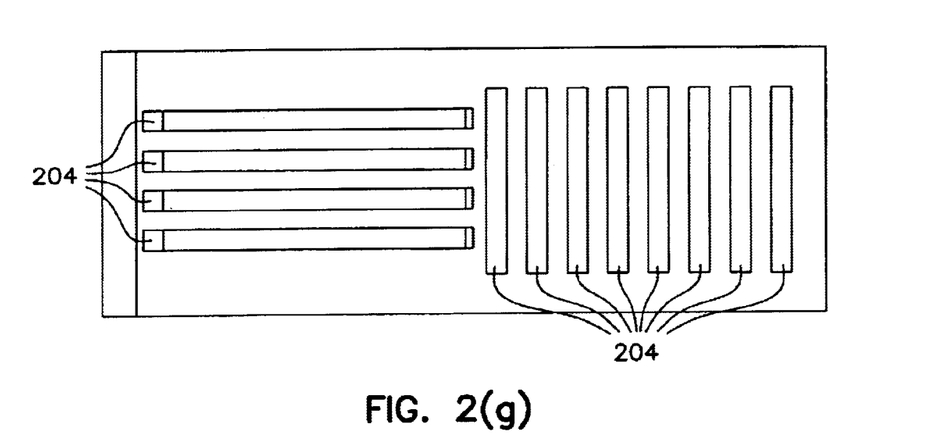

Finally, FIG. 2(d) shows a portion of the silicon island structure that may be used as the seed points for the epitaxial growth of the N+ substrate level, while FIG. 2(e) shows a schematic layout of possible contacts to the buried wiring lines (both within layer 204 and layer 206). The structure of FIGS. 2(a)–2(e) thus is a three-dimensional semiconductor structure, having two levels of buried wiring lines; each level of buried wiring lines includes lines oriented in the x and the y planes. Such buried wiring lines may render it unnecessary to use external wiring for connections of the structure.

Exemplary Method to Form Buried Conductors

In this section of the detailed description, an exemplary method to form buried conductors, according to one embodiment of the invention, is described. Utilizing this method, those of ordinary skill within the art will then be able to form the exemplary structures of the previous section.

Figure 3A:
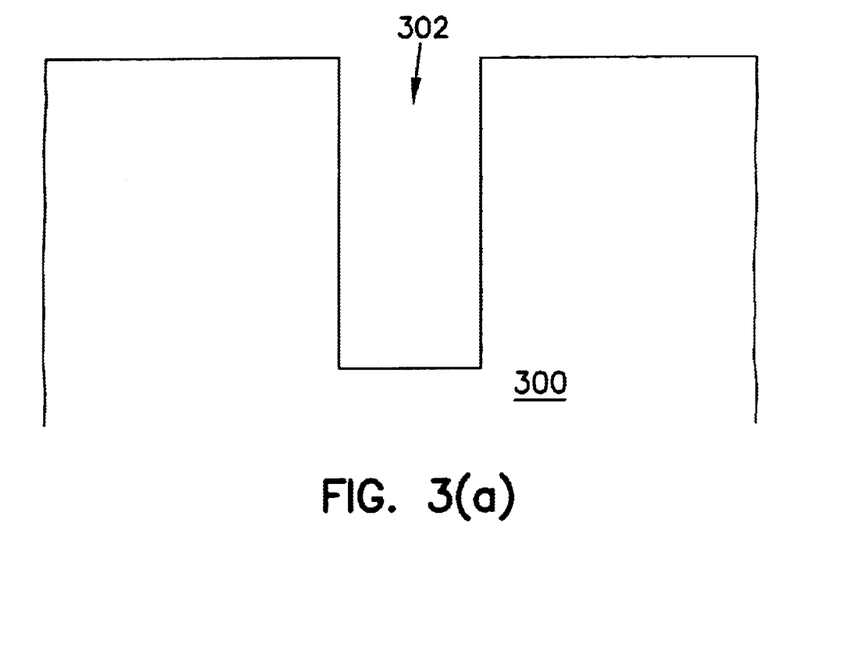
Figure 3B:
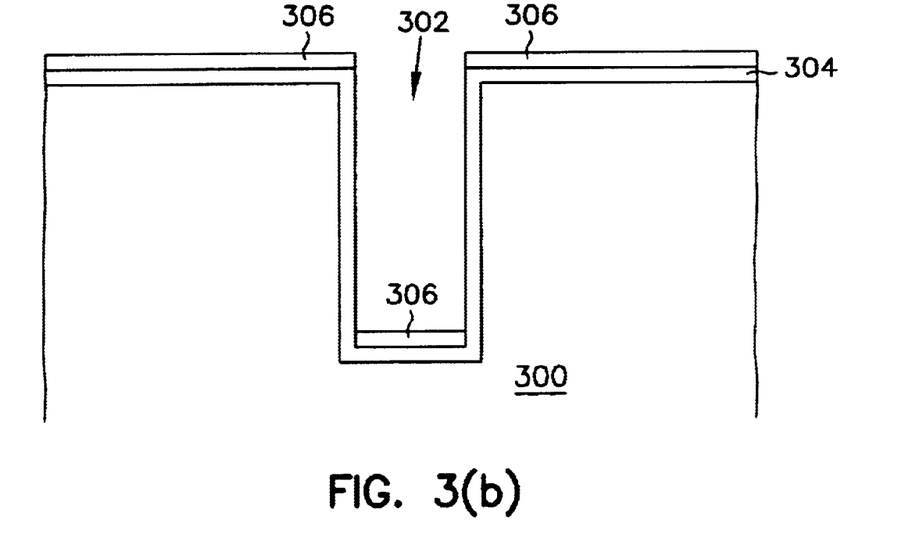

Referring first to FIG. 3(a), within silicon substrate 300, trench 302, of the desired width and depth is cut. Trench 302 has a bottom, and at least two sidewalls. Substrate 300 is part of a wafer having a front side (top) and a back side (bottom). Referring next to FIG. 3(b), oxidation is performed to produce oxide layer 304 of sufficient thickness to provide electrical insulation for the subsequently formed wire. Oxide layer 304 is present on the bottom and the walls of trench 302. Seed layer 306 is then deposited, desirably using a line of sight deposition process such as collimated sputtering. In one embodiment, seed layer 306 is titanium, although the invention itself is not so limited to this material. The seed material may be an element selected from groups IVB, VB, or VIB, of the periodic table, for example.

Figure 3C:
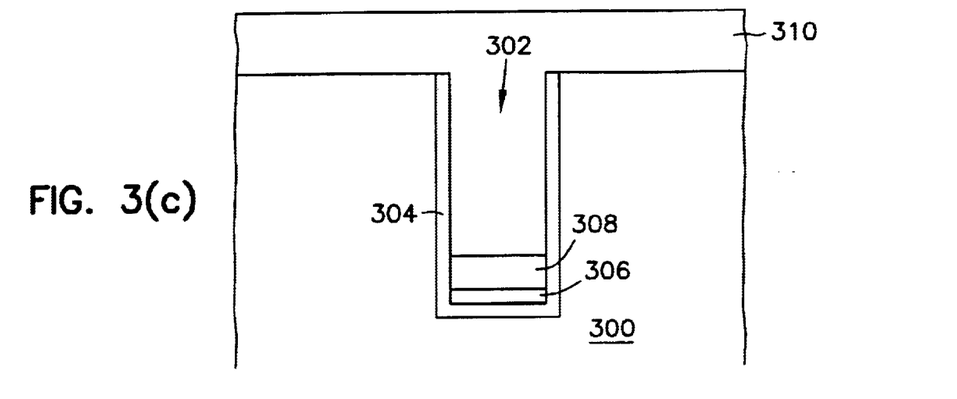

Referring next to FIG. 3(c), the seed layer and the oxide on the top surface of the wafer (i.e., not at the bottom of trench 302) is removed, desirably by chemical mechanical polishing (CMP), or another selective removal process. The conductive material to be used to form the buried wiring level is then deposited within the trench, such as tungsten 308, substantially at the bottom of the trench (i.e., over the seed layer). This is desirably accomplished by a selective metal deposition process, such as plating or chemical vapor deposition. (However, a line of sight process—such as columnated sputtering or long through evaporation—may also be used, in which case a seed layer deposition prior to conductive material deposition is unnecessary.) Any incidental deposition on the surface of the wafer may be removed by CMP. Insulative material 310 is then deposited to sufficiently fill the trench. Material 310 may be oxide (silicon dioxide), or any other suitable insulator.

Figure 3D:
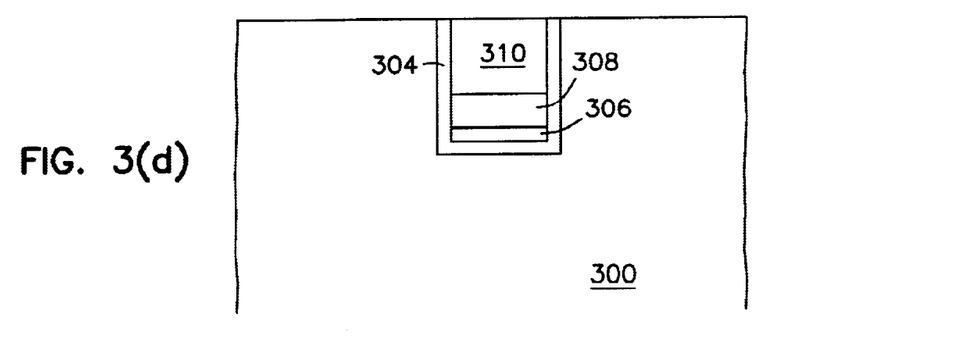

Referring next to FIG. 3(d), the top wafer surface is again polished by CMP or another suitable process to expose substrate 300, but not far enough to expose tungsten 308. The exposed substrate 300 may then be used as seed points for epitaxial silicon growth. It is noted that the width of tungsten 308 within trench 302 is less than the photo image that was used to etch trench 302; thus, it is possible to produce line widths that are less than the minimum photo-definable image.

Figure 3E:
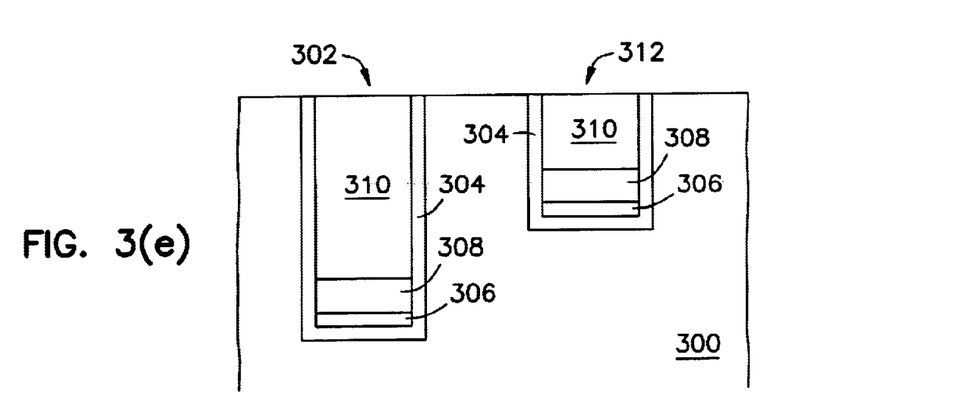

Referring finally to FIG. 3(e), the process of FIGS. 3(a) through 3(e) may be repeated to produce another level of buried wiring. Thus, as shown in FIG. 3(e), two buried conductors are present: a deeper conductor at the bottom of trench 302, and a shallower conductor at the bottom of trench 312. Greater-depth conductors are formed first, and then lesser-depth conductors are formed. Utilizing the described process, any number of buried wiring levels may be produced. Furthermore, while as described only one trench for each layer has been formed, those of ordinary skill within the art can appreciate that any number of trenches for each layer may be formed.

Other steps may also be added to the described process. For example, the back side of the wafer may be thinned to expose parts of at least the bottom-most conductive layer. For further example, the first layer may be connected to the second layer, using ion-implanted nitrogen, as described in the coassigned and copending application entitled "Implanted Conductor and Method of Making," filed Mar. 14, 1997, Ser. No. 08/818,230, or using a conventional fill strategy as known within the art.

Specific Processes

Utilizing the exemplary method described in the previous section of the detailed description, those of ordinary skill in the art are thus enabled to form the exemplary structures described in the first section of the detailed description. However, specific processes to form the exemplary structures of the first section of the detailed description are provided in this section of the detailed description. These processes correspond to the exemplary method described in the previous section, except that more specific detail is provided.

A specific process that can be used to produce the structures of FIG. 1(a) and FIG. 1(c) (except for the tungsten connection of FIG. 1(c), a process to form such a connection having already been described) is first provided. Starting with an N+ wafer, 0.3 micron width trenches 1.2 microns deep are etched in the silicon to form the spaces for the first (deepest) level of wiring. 850 angstrom of thermal oxide are then grown, thus reducing the trench width to 0.225 micron. Alternatively, instead of growing thermal oxide, 500 angstroms of CVD oxide may be deposited. The use of a CVD layer is particularly advantageous when several layers of buried wiring are to be used. 75 angstrom of titanium is then deposited using collimated sputtering. Chemical mechanical polishing is performed to remove titanium and oxide from the wafer surface, exposing the N+ silicon underneath. Next, 0.4 micron of tungsten is selectively deposited over the titanium, using low-temperature hydrogen reduction of tungsten fluoride, where the titanium serves as the seed layer. 1450 angstrom of silicon dioxide is deposited, and chemical mechanical polishing is used to remove the oxide from the wafer surface, but leaving oxide over the tungsten-filled trenches. Thus, the first wiring level is constructed.

A second wiring level is constructed by first etching 0.3 micron width trenches 0.6 micron deep in the silicon and the oxide where the trench crosses the oxide-covered tungsten of the first wiring level. 850 angstrom silicon oxide is deposited, and 75 angstrom of titanium is deposited. The titanium and oxide on the wafer surface is removed via chemical mechanical polishing. If connections are desired between the two levels of conductors, they can be made through the insulator separating the layers (or the conducting layer and an active device) using ion-implanted nickel, as described in the coassigned and copending application entitled "Implanted Conductor and Method of Making," filed Mar. 14, 1997, Ser. No. 08/818,230, or using a conventional fill strategy as known within the art. 0.4 micron of tungsten is selectively deposited over the titanium, and chemical mechanical polishing or another suitable technique is used to remove any tungsten inadvertently deposited on the wafer surface. 5200 angstrom of oxide is deposited via chemical vapor deposition to fill the trenches and cap the conductors.

Finally, chemical mechanical polishing is used to remove the oxide and expose the silicon surface. The open windows of the exposed N+ silicon are used as nucleation points to grow P– silicon epitaxially. A desired photo mask is used to define the areas of P–/N+ contact and to selectively remove the P– silicon. 1000 angstrom of oxide is deposited, and chemical mechanical polishing is used to expose the P– silicon. Finally, the P– areas that are exposed are used as nucleating sites to grow a P– epitaxial layer to cover the wafer surface.

A specific process that can be used to form the structure of FIG. 1(b) is now described. On an N+ wafer, 0.3 micron width trenches, 0.6 microns deep, are etched to form the spaces for the buried level of wiring. 850 angstrom of thermal oxide is grown. 75 angstrom of titanium is deposited using collimated sputtering, to provide a seed layer for the conductive material. Chemical mechanical polishing, or another suitable technique, is used to remove titanium and oxide from the wafer surface. 0.4 micron of tungsten is selectively deposited at the bottom of the trench, using low temperature hydrogen reduction of tungsten fluoride, where the titanium serves as the seed layer. 1075 angstrom of oxide is deposited, and chemical mechanical polishing is used to remove the oxide from the wafer surface. The resulting open windows to the N+ silicon are used as nucleation points to grow a P− silicon epitaxial layer.

Next, an appropriate photomask is used to define the areas of P−/N+ contact, and the deep trench capacitor is etched. A desired oxygen-nitrogen-oxygen (ONO) structure, or other dielectric, is grown to provide the capacitor dielectric. The capacitor trench is then filled with P+ polysilicon, and chemical mechanical polishing is used to expose the P+ silicon surface. Conventional processing may then be used to form devices and memory cells within the active layer.

Finally, a specific process that can be used to produce the structure of FIGS. 2(a)–2(e) is described. On an N-type wafer, 0.3 micron width trenches, 1.2 microns deep, are etched to form the spaces for the first (deepest) level of wiring. 850 angstrom of thermal oxide is grown, and 75 angstrom of titanium is deposited using collimated sputtering. Chemical mechanical polishing is used to remove titanium and oxide from the wafer surface. 0.4 micron of tungsten is selectively deposited over the titanium at the bottom of the trench using low temperature hydrogen reduction of tungsten fluoride, the titanium serving as the seed layer. 1450 angstrom of oxide is deposited, and chemical mechanical polishing is used to remove the oxide from the wafer surface.

Next, 0.3 micron width troughs, 0.6 microns deep, are etched in the silicon and the oxide in the pattern of the upper (second) level of metal. 850 angstrom of thermal oxide is CVD deposited and 75 angstrom of titanium is deposited. Titanium and oxide from the wafer surface is removed via chemical mechanical polishing. If connections are desired between the two levels of conductors, they can be made through the insulator separating the layers (or the conducting layer and an active device) using ion-implanted nickel, as described in the coassigned and copending application entitled "Implanted Conductor and Method of Making," filed Mar. 14, 1997, Ser. No. 08/818,230, or using a conventional fill strategy as known within the art. 0.4 microns of tungsten are selectively deposited over the titanium. If necessary, any tungsten inadvertently deposited on the wafer surface is removed using chemical mechanical polishing or other suitable techniques. 5200 angstrom of oxide is deposited via chemical vapor deposition, and chemical mechanical polishing is used to remove the oxide sufficiently to expose the N+ silicon surface.

Next, using the open windows to the N+ silicon as nucleation points, P− silicon is grown epitaxially. If contacts from the buried wiring levels to structures on or above the P− epitaxial surface are desired, windows are etched in the epitaxial layer using a mask (such as that which has been shown in FIG. 2(d)). An oxide layer equal in thickness to the P− silicon layer is then deposited, and the surface of the wafer is polished (via chemical mechanical polishing) to expose the P− silicon; contact is then made to the wiring levels using ion-implanted nickel as described in the coassigned and copending application entitled "Implanted Conductor and Method of Making," filed Mar. 14, 1997, Ser. No. 08/818,230, or using a conventional fill strategy as known within the art.

Those of ordinary skill within the art can appreciate that the order of the processes described may be modified without affecting materially the final structure produced. For example, in the process just described, the oxide could be removed from the wafer surface prior to titanium deposition, with the titanium on the surface being removed in a subsequent polishing process. The seed layer used could be other materials besides titanium, such as zirconium. Similarly, while the material used for the wiring structure was described as tungsten, other metals and alloys thereof are suitable. Desirably, a material of sufficiently low resistance to provide a good electrical conductor is used. Sufficient electromigration resistance to enable the required current to be carried without failure during the devices' expected lifetime is desirable.

Furthermore, the diffusion rate of the element or elements used as conductors through the oxide or other insulator should desirably be low enough so that the amount diffusing through the insulating film and into the silicon is insufficient to degrade the properties of the device or devices formed in the various silicon layers. The melting point of the metal or alloy used should desirably be sufficiently high to prevent its melting or other unwanted metallurgical changes during further processing of the silicon. For example, aluminum and aluminum alloys that have been used in traditional wiring applications may have melting points that are low enough to cause concern; however, future changes in processing technology that may lower the temperature requirements of device operation may mute this concern.

In addition, copper, which has a high diffusion rate in silicon dioxide and is a junction "poison," as known within the art, is another metal which at the time of filing of this patent application may not be able to be considered for use unless a suitable barrier layer surrounds it. The requirements for the buried wiring levels may be fulfilled with more or less ease by a number of materials, including the non-radioactive elements of groups IVB, VB, VIB, VIIB, and VIIIB of the periodic table. Of these elements, those in groups VB, VIB and VIIIB may be most desirable because of their lower resistance. A material such as tungsten may be desired because of its reasonably low resistance and because its deposition is relatively well understood by those of ordinary skill within the art.

Furthermore, although selective chemical vapor deposition has been specifically referenced to deposit the conductive material after the seed layer has been deposited, the invention is not so limited to such deposition. For example, electroless plating may be substituted for selective chemical vapor deposition. Also, instead of chemical vapor deposition oxide for the final trench fill after the last metal deposition, an alternative material such as polyimide may also be used.

Representative Memory Device

Figure 4:
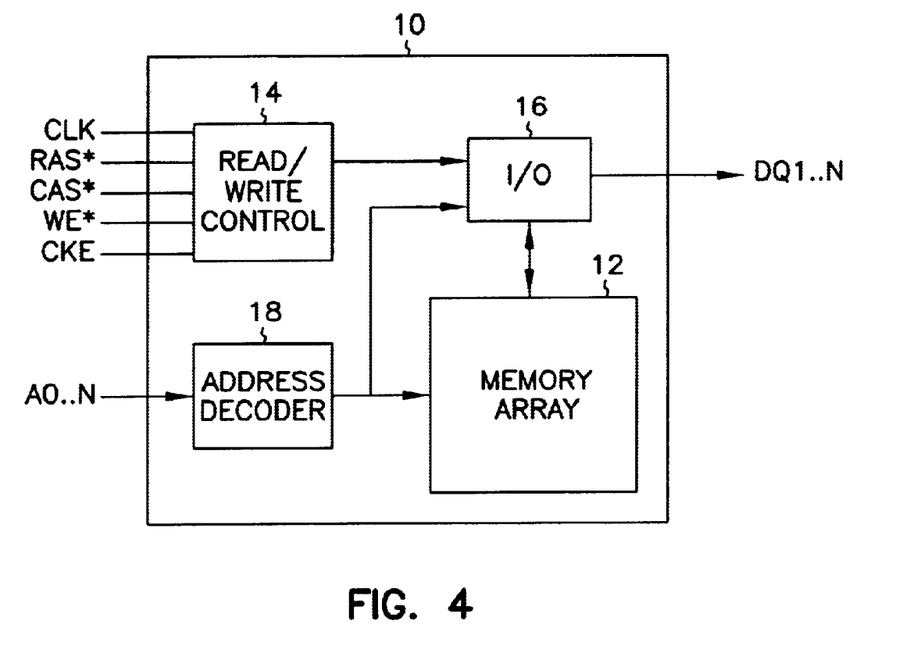

In this section, a typical memory device in conjunction with which an embodiment of the invention may be implemented is described. Referring to FIG. 4, memory device 10 includes memory array 12, control circuit 14, input/output buffers 16, and address decoder 18. Memory array 12 includes a plurality of memory cells organized into rows and columns. The memory cells are accessed in response to an address signal provided on the address lines A0 . . . AN running to address decoder 18, which includes both row and column decoder circuitry. Input/output buffers 16 are provided for bidirectional communication via the data communications lines DQ1 . . . DQN running out of buffers 16. Control circuit 14 regulates the memory device operations in response to control signals including, but not limited to, a Clock (CLK), a Row Access Strobe (RAS*), a Column Access Strobe (CAS*), a Write Enable (WE*), and a Clock Enable (CKE).

As will be appreciated by those skilled in the art, the present invention is not limited to any particular type of memory device or repair memory device. In one embodiment, the devices are dynamic random-access-memories (DRAMs), including those available from Micron Technology, Inc., of Boise, Id. In other embodiments, the devices are static random-access-memories (SRAMs), flash memories, synchronous dynamic random-access-memories (SDRAMs), extended-data-out random-access-memories (EDO RAMs), and burst-extended-data-out random-access-memories (BEDO RAMs), as those skilled in the art will appreciate.

CONCLUSION

Buried conductors have been described. The utilization of such conductors provides for internal wiring levels within semiconductor structures and devices, making external wiring levels unnecessary. Thus, three-dimensional structures, such as stacked-chip arrays, may be constructed without resorting to such external wiring levels. This renders these structures faster, and more densely integrated, than would otherwise be possible. Those of ordinary skill within the art can, however, appreciate that other advantages may and can be provided by the invention.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the following claims and equivalents thereof

We claim:

1. A semiconductor structure comprising:
a substrate layer having an active semiconductor layer formed thereon;
a first buried layer buried at a first depth within the substrate and consisting of a plurality of substantially parallel first conductive elements oriented in a first direction;
a second buried layer buried at a second depth within the substrate and consisting of a plurality of substantially parallel second conductive elements oriented in a second direction orthogonal to the first direction, wherein the second depth is greater than the first depth;
insulating material arranged to separate the first and second buried layer and to separate the first and second conductive elements,
wherein the first buried layer and the second buried layer are substantially parallel to the active semiconductor layer;
wherein the insulating material separates the first buried layer from the active semiconductor layer;
wherein the first buried layer and the second buried layer include a material with a high melting point that prevents unwanted metallurgical changes when processing the active semiconductor layer; and
wherein the plurality of substantially parallel second conductive elements are connected to conductive parts that extend upwardly on opposite sides of the first buried layer beyond the first depth adjacent outer ones of the plurality of substantially parallel first conductive elements.

2. The structure of claim 1, wherein at least one of the first conductive elements and the second conductive elements is a metal.

3. The structure of claim 2, wherein the metal comprises one of tungsten and a tungsten alloy.

4. The structure of claim 1, wherein the substrate comprises doped silicon.

5. The structure of claim 1, wherein the insulating material is selected from the group consisting of: oxide, oxy-nitride, and nitride.

6. A semiconductor structure comprising:
a substrate layer having an active semiconductor layer formed thereon;
a first buried layer buried at a first depth within the substrate and consisting of a plurality of substantially parallel first conductive elements oriented in a first direction and surrounded by an insulating material;
a second buried layer buried at a second depth within the substrate, separated from the first buried layer by the insulating material, the second buried layer consisting of a plurality of substantially parallel second conductive elements surrounded by the insulating material and oriented in a second direction orthogonal to the first direction, wherein the second depth is different than the first depth;
a connection formed between the first and second buried layers;
wherein the first and second buried layers are substantially parallel to the active semiconductor layer and include a material with a high melting point that prevents unwanted metallurgical changes; and
wherein the plurality of substantially parallel conductive elements are connected to conductive parts that extend upwardly on opposite sides of the first buried layer beyond the first depth adjacent outer ones of the plurality of substantially parallel first conductive elements.

7. The structure of claim 6, wherein at least one of the first conductive elements, the second conductive elements and the connector is metal.

8. The structure of claim 7, wherein the metal comprises one of tungsten and a tungsten alloy.

9. The structure of claim 6 wherein the substrate comprises doped silicon.

10. The structure of claim 6 wherein the insulating material is selected from the group consisting of: oxide, oxy-nitride, and nitride.

11. A semiconductor device comprising:
a substrate having an active semiconductor layer formed thereon;
a first buried layer buried at a first depth within the substrate and consisting of a plurality of substantially parallel first conductive elements oriented in a first direction;
a second buried layer buried at a second depth within the substrate and comprising a plurality of substantially parallel second conductive elements oriented in a second direction orthogonal to the first direction, wherein all of the first conductive elements are not electrically connected to the second conductive elements, wherein the second depth is different than the first depth;

a conductive connection formed beneath one of the buried layers and arranged to provide an external connection to one of the buried layers; and wherein the plurality of substantially parallel second conductive elements are connected to conductive parts that extend upwardly on opposite sides of the first buried layer beyond the first depth adjacent outer ones of the plurality of substantially parallel first conductive elements.

12. The device of claim 11 wherein at least one of the first conductive elements, the second conductive elements and the connection is a metal.

13. The device of claim 12, wherein the metal comprises one of tungsten and a tungsten alloy.

14. The device of claim 11 wherein the substrate comprises doped silicon.

15. The structure of claim 11 wherein the insulating material is selected from the group consisting of: oxide, oxy-nitride, and nitride.

16. The device of claim 11 wherein the first and second buried layers are substantially parallel to the active semiconductor layer.

17. The semiconductor device of claim 11 wherein the first buried layer includes a material with a high melting point that prevents unwanted metallurgical changes.

18. A semiconductor device comprising:

a substrate having an active semiconductor layer formed thereon;

a first buried layer buried at a first depth within the substrate and comprising a plurality of substantially parallel first conductive elements oriented in a first direction and a plurality of substantially parallel second conductive elements oriented in a second direction orthogonal to the first direction, wherein the first conductive elements are not electrically connected to any of the second conductive elements;

a second buried layer buried at a second depth within the substrate and comprising a plurality of substantially parallel third conductive elements oriented in a third direction and a plurality of substantially parallel fourth conductive elements oriented in a fourth direction orthogonal to the third direction, wherein the second depth is different than the first depth; and wherein the plurality of substantially parallel third conductive elements are connected to conductive parts that extend upwardly on opposite sides of the first buried layer beyond the first depth adjacent outer ones of the plurality of substantially parallel first conductive elements.

19. The semiconductor device of claim 18, wherein the first buried layer and the second buried layer are parallel.

20. The semiconductor device of claim 18, wherein the first buried layer and the second buried layer have surfaces in non-intersecting planes.

21. The semiconductor device of claim 18 wherein the first buried layer includes a material with a high melting point that prevents unwanted metallurgical changes.

22. A semiconductor structure comprising:

a substrate layer having an active semiconductor layer formed thereon;

a first buried layer buried at a first depth within the substrate and consisting of a plurality of substantially parallel first conductive elements oriented in a first direction, the plurality of first conductive elements each having a surface in a first plane;

a second buried layer buried at a second depth within the substrate and consisting of a plurality of substantially parallel second conductive elements oriented in a second direction orthogonal to the first direction, the plurality of second conductive elements each having a surface in a second plane, wherein the second depth is different than the first depth insulating material arranged to separate the first plane and the second plane and to essentially surround the first and second conductive elements, wherein the first plane and the second plane are substantially parallel to the active semiconductor layer; and wherein the plurality of substantially parallel second conductive elements are connected to conductive parts that extend upwardly on opposite sides of the first buried layer beyond the first depth adjacent outer ones of the plurality of substantially parallel first conductive elements.

23. The semiconductor device of claim 22 wherein the first buried layer includes a material with a high melting point that prevents unwanted metallurgical changes.

24. A semiconductor device comprising:

substrate having an active semiconductor layer formed thereon;

a first buried layer buried at a first depth within the substrate and comprising a plurality of substantially parallel first conductive elements oriented in a first direction and a plurality of substantially parallel second conductive elements oriented in a second direction orthogonal to the first direction, wherein all of the first conductive elements are not electrically connected to the second conductive elements, wherein the plurality of first conductive elements each include a surface in a first plane;

a second buried layer buried at a second depth within the substrate and comprising a plurality of substantially parallel third conductive elements oriented in a third direction and a plurality of substantially parallel fourth conductive elements oriented in a fourth direction orthogonal to the third direction, wherein the plurality of third conductive elements each include a surface in a second plane, wherein the second depth is different than the first depth; and wherein the plurality of substantially parallel third conductive elements are connected to conductive parts that extend upwardly on opposite sides of the first buried layer beyond the first plane adjacent outer ones of the plurality of substantially parallel first conductive elements.

25. The semiconductor device of claim 24, wherein the first and second planes are parallel to each other.

26. The semiconductor device of claim 25, wherein the first plane is parallel to the active device region.

27. The semiconductor device of claim 24, wherein the plurality of second conductive elements each include a surface in the first plane.

28. The semiconductor device of claim 27 wherein the plurality of fourth conductive elements each include a surface in the second plane.

29. The semiconductor device of claim 24 wherein the plurality of fourth conductive elements each include a surface in the second plane.

30. The semiconductor device of claim 24, wherein the first buried layer includes a material with a high melting point that prevents unwanted metallurgical changes.

31. A semiconductor device comprising:

a substrate having an active semiconductor layer formed thereon;

a first buried layer buried at a first depth within the substrate and consisting of a plurality of substantially parallel first conductive elements oriented in a first direction and a plurality of substantially parallel second conductive elements oriented in a second direction orthogonal to the first direction, wherein all of the first conductive elements are not electrically connected to the second conductive elements, wherein the first buried layer includes a material with a high melting point that prevents unwanted metallurgical changes;

a second buried layer buried at a second depth within the substrate and constituting of a plurality of substantially parallel third conductive elements oriented in a third direction and a plurality of substantially parallel fourth conductive elements oriented in a fourth direction orthogonal to the third direction, wherein the second depth is different than the first depth; and wherein the plurality of substantially parallel third conductive elements are connected to conductive parts that extend upwardly on opposite sides of the first buried layer beyond the first depth adjacent outer ones of the plurality of substantially parallel first conductive elements.

* * * * *

UNITED STATES PATENT AND TRADEMARK OFFICE
CERTIFICATE OF CORRECTION

PATENT NO. : 6,696,746 B1
DATED : February 24, 2004
INVENTOR(S) : Paul A. Farrar and Wendell P. Noble It is certified that error appears in the above-identified patent and that said Letters Patent is hereby corrected as shown below:

Drawings,
Sheet 1, FIG. 1(a), insert parallel dashed lines between layers 102 and 104.

Column 2,
Line 10, below "invention;" inserT the following paragraph:
-- FIGS. 2(a), 2(b), 2©, 2(d) and 2(e) show an ememplary semiconductor structure according to an embodiment of the invention; --.

Column 3,
Line 52, delete "lines 114 and line 114" and insert -- line 112 and line 114 --, therefor.

Column 5,
Line 5, delete "skiff" and insert -- skill -- therefor.

Column 7,
Line 22, delete "P+" and insert -- P– -- therefor.

Column 10,
Line 37, insert -- second -- after "parallel".
Line 46, insert -- a -- after "is".
Lines 49 and 51, insert -- , -- after "claim 6".

Column 11,
Lines 10, 14, 16, 19 and 22, insert -- , -- after "claim 11".
Line 55, insert -- , -- after "claim 18".

Column 12,
Line 5, insert -- , -- after "depth".
Line 17, insert -- , -- after "claim 22".
Line 21, insert -- a -- before "substrate".
Line 56, insert -- , -- after "claim 27".
Line 59, insert -- , -- after "claim 24".

UNITED STATES PATENT AND TRADEMARK OFFICE
CERTIFICATE OF CORRECTION

PATENT NO. : 6,696,746 B1
DATED : February 24, 2004
INVENTOR(S) : Paul A. Farrar and Wendell P. Noble It is certified that error appears in the above-identified patent and that said Letters Patent is hereby corrected as shown below:

Column 13,
Line 13, delete "constituting" and insert -- consisting -- therefor.

Signed and Sealed this

Fourteenth Day of September, 2004

JON W. DUDAS
*Director of the United States Patent and Trademark Office*